United States Patent [19]

Trask et al.

[11] Patent Number: 5,034,091

[45] Date of Patent: Jul. 23, 1991

[54] METHOD OF FORMING AN ELECTRICAL VIA STRUCTURE

[75] Inventors: Philip A. Trask, Laguna Hills; Gabriel G. Bakhit, Huntington Beach; Vincent A. Pillai, Irvine; Kirk R. Osborne, Los Angeles; Kathryn J. Berg, Long Beach; Gary B. Warren, Huntington Beach, all of Calif.

[73] Assignee: Hughes Aircraft Company, Los Angeles, Calif.

[21] Appl. No.: 515,813

[22] Filed: Apr. 27, 1990

[51] Int. Cl.⁵ .................. B44C 1/22; B29C 37/00; C23F 1/02; C03C 15/00

[52] U.S. Cl. .................. 156/643; 156/644; 156/655; 156/656; 156/661.1; 156/668; 156/901; 430/313; 430/317; 430/318

[58] Field of Search .............. 174/262, 266; 430/312, 430/313, 314, 316, 317, 318; 427/97; 29/852; 156/643, 644, 652, 655, 656, 659.1, 661.1, 668, 901, 902; 204/192.32, 192.35, 192.36

[56] References Cited

U.S. PATENT DOCUMENTS

| | | | |
|---|---|---|---|
| 3,986,912 | 10/1976 | Alcorn et al. | 156/644 X |
| 4,426,249 | 1/1984 | Brown et al. | 156/661.1 X |
| 4,461,672 | 7/1984 | Musser | 156/644 |
| 4,484,978 | 11/1985 | Keyser | 156/651 X |
| 4,631,248 | 12/1986 | Pasch | 156/651 X |
| 4,645,562 | 2/1987 | Liao et al. | 156/644 X |
| 4,806,199 | 2/1989 | Gualandris | 156/651 X |
| 4,816,115 | 3/1989 | Horner et al. | 156/651 X |

OTHER PUBLICATIONS

A Planar Approach to High Density Copper-Polyimide Interconnect Fabrication, by J. Tony Pan, Steve Poon, Brad Nelson, pp. 90-106.

Primary Examiner—William A. Powell
Attorney, Agent, or Firm—Jeannette M. Walder; Terje Gudmestad; W. K. Denson-Low

[57] ABSTRACT

A via (26) is formed through a dielectric layer (8) separating two conductive layers (16,28) by establishing a laterally erodible mask (18) over the dielectric (8), with a window (24) over the desired via location. The mask (18) and exposed dielectric material (8) are eroded simultaneously, preferably by reactive ion etching, producing a via (26) through the dielectric (8) which expands laterally as vertical erosion proceeds. The erosion conditions, the materials for the mask (18) and dielectric (8), and the initial window (24) taper are selected so that the final via (26) is tapered at an angle of less than about 45° to the lower metal layer (6), and preferably about 30°-45°, to enable a generally uniform width for the upper metallization (28) in the via (26). A non-erodible mask (10) is established over the dielectric layer (8) lateral to the via (26) during fabrication to prevent the propagation of pinhole defects from the erodible mask (18) into the dielectric (8), and is normally removed prior to completing the structure.

18 Claims, 5 Drawing Sheets

METHOD OF FORMING AN ELECTRICAL VIA STRUCTURE

BACKGROUND OF THE INVENTION

1. Field of the Invention

This invention relates to high density multi-chip interconnect substrates, and more particularly to the formation and resulting structure of vias between conductive planes of such substrates.

2. Description of the Related Art

The increasing sophistication of microelectronics technology has spurred the development of smaller, faster and denser microelectronics circuits. This has resulted in the development of high density multi-chip interconnect (HDMI) technology. An HDMI substrate is a system of multiple layers of thin film conductor patterns, separated by polyimide dielectric layers fabricated on silicon or ceramic based carrier wafers. HDMI substrates are required to accommodate the large number of signal input/outputs on advanced integrated circuits. The substrate interconnections must be short and have well controlled electrical characteristics to propagate high speed signals with minimal delay, distortion and cross-talk. Internal layer-to-layer connections in multilayered HDMI substrates are made by means of "vias", which extend through intermediate dielectric layers to connect conductive layers on either side of the dielectric.

The two processes currently used to form vias in HDMI substrates are a plating process which forms the vias by plating metal into vias through holes opened in a photoresist plating mask, and an etching process in which vias are formed by etching holes in the dielectric layer and sputtering metal interconnects over and into the vias.

The vias will ideally have certain characteristics to optimize their performance. First, the metal deposited on the via walls should be of generally uniform thickness with no thinned or vacant areas, to assure a low impedance connection over wide temperature ranges. Second, it would be desirable to be able to fabricate vertically stacked vias. In multi-layered HDMI substrates, the electrical path from the top integrated circuit bond pad layer to the signal or power and ground planes is through a series of vias. An ability to stack the multiple vias in vertical alignment with each other minimizes the "real estate" occupied by the vias, and enables a denser packaging of IC components.

Unfortunately, neither of the prior approaches satisfies both of these conditions. Plated type pillar fabrication, in which a vertical pillar is formed as the via, is compatible with vertically stacked multiple vias because the additive plating process results in cylindrical via pillars that can be made continuous from layer to layer. Plating, however, has other disadvantages, particularly when used in conjunction with polyimide. The adherence of the polyimide to the metal plating can be compromised, since plating is a wet process and polyimide is inherently hygroscopic. For this reason, dry processing is preferable. With plated pillars it is difficult to control the pillar height and the uniformity of the plating. In addition, it is necessary to planarize the structure by etching back or mechanically lapping the dielectric to expose the tops of the vias, so that the next metal layer can make contact.

The etched via process uses a silicon dioxide or other hard, non-erodible etch mask to establish the location of the via. This results in a via profile that is significantly more vertical than horizontal. It is difficult to sputter a conductive coating onto the inner walls of such vias, and the metal can be severely thinned and even completely open in spots, making the vias defective or at least suspect in terms of their reliability and survivability over wide temperature ranges.

Another disadvantage of the etched process is an inability to form vertically stacked vias of more than two layers. Passing electrical signals from one conductive plane to another has typically been accomplished by offsetting or stair-stepping the vias; a via through one polyimide layer terminates on the metal of the underlying conductive layer, which provides a contact to another via which is laterally offset from the first one. The result is a requirement for additional circuit routing area to accommodate the staggered vias. This limitation becomes more severe as the number of routing layers and corresponding staggered vias increases.

SUMMARY OF THE INVENTION

The present invention seeks to provide a new via structure and fabrication method which results in vias that can accommodate a uniform, reliable metal coating, and are easily adaptable to vertically aligned stacking.

These goals are achieved with a unique fabrication process that results in vias having a taper angle of less than about 45° to horizontal, and preferably in the range of about 30°–45° to horizontal. With this degree of taper, a metal coating of uniform thickness can readily be deposited over the via walls, and there is sufficient exposed area to accommodate vertical stacking of multiple vias.

Such a via is formed by first providing a laterally erodible mask, preferably a photoresist, over a dielectric layer of the substrate, which in turn overlies a conductive layer. A window is formed in the mask at the desired via location. The mask material and the exposed portion of the underlying dielectric layer are then simultaneously eroded, preferably by reactive ion etching. The mask recedes laterally from the via as the etching continues and thus expands the window, resulting in a tapered via through the dielectric. The degree of taper is determined by the materials selected for the mask and dielectric, the etching conditions, and the initial window taper. The result is a generally bowl-shaped via that can readily be controlled to have the desired degree of taper.

The use of an erodible photoresist mask rater than a hard silicon dioxide mask can lead to other problems not encountered with the prior fabrication techniques. Defects from the photoresist can be replicated in the dielectric layer as the etching process proceeds, resulting in pin hole defects in the dielectric which can short circuit the conductive layers on either side in a severe case. This problem is remedied by providing a non-erodible mask, such as aluminum or copper, between the dielectric layer and the erodible mask in an area lateral to the via. The non-erodible mask prevents the propagation of defects from the photoresist into the underlying dielectric, and is generally removed along with any remaining photoresist after the via has been formed but before a second conductive layer is deposited over the dielectric. The non-erodible mask initially has a window which surrounds the via and is at least as large as the final eroded area of the via, to avoid obstructing the via formation process. After the second conductive layer has been deposited, the layer is patterned by projection lithography to electrically isolate the via from the conductive layer overlying the portion of the dielectric which has been protected from replicated defects.

These and other features and advantages of the invention will be apparent to those skilled in the art from the following detailed description, taken together with the accompanying drawings, in which:

DETAILED DESCRIPTION OF THE INVENTION

Figure 1A:
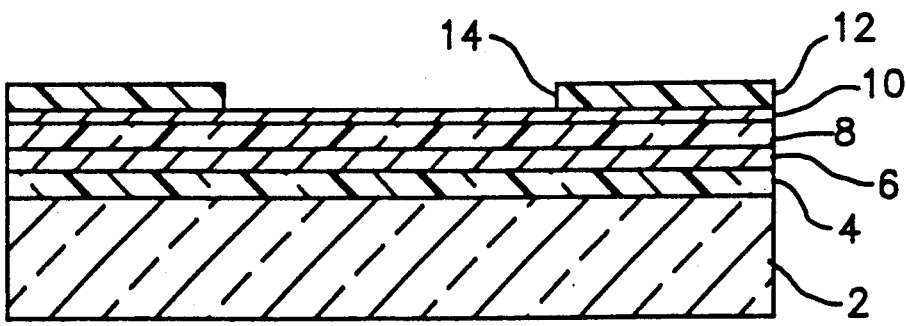
FIGS. 1a–1h are sectional views showing sequential steps in the fabrication of an HDMI via in accordance with the invention.

FIGS. 1a–1h illustrate the preferred method for fabricating the new HDMI structure. Referring first to FIG. 1a, a substrate wafer (typically silicon) 2 is initially planarized with a layer of polyimide dielectric 4 (typically about 10 microns thick) to remove surface irregularities. A conductive layer 6, which will form a ground plane for the finished structure, is then sputtered on and patterned with standard photolithographic techniques. Conductive layer 6 is formed from a metal, typically about 5 microns thick. Another dielectric polyimide layer 8, typically about 10 microns thick, is then applied over the patterned ground metal layer 6.

Up to this point the structure is conventional. In the next step, however, a thin masked layer 10 is sputtered on top of the upper dielectric layer 8. An important characteristic of mask layer 10 is that it is non-erodible by a subsequent reactive ion etching step, and inhibits the replication or propagation of random pinhole hole defects from an overlying photoresist into the dielectric layer 8 at a later stage in the fabrication. Mask layer 10 is preferably formed from a metal such as aluminum or copper, and can be only about $\frac{1}{2}$ micron thick.

A thin layer of photoresist 12 is formed over the mask 10. A window 14 is established in the photoresist over the intended location of a via through dielectric layer 8. Window 14 can be formed photolithographically with a glass mask (not shown), exposure of the unmasked photoresist, and subsequent removal of the photoresist from the window area. The window should encompass an area at least as great as the area of the ultimate via.

Figure 1B:
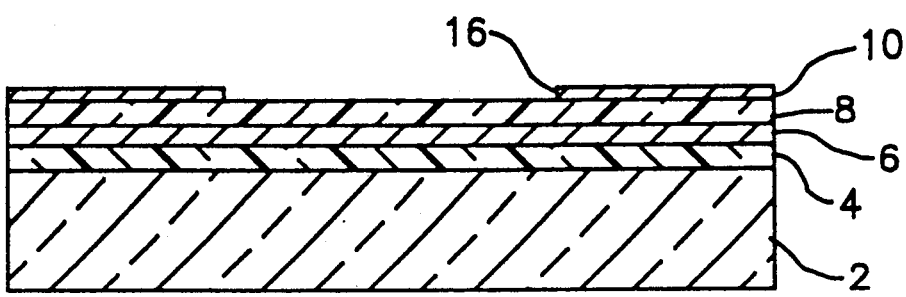
Figure 1C:
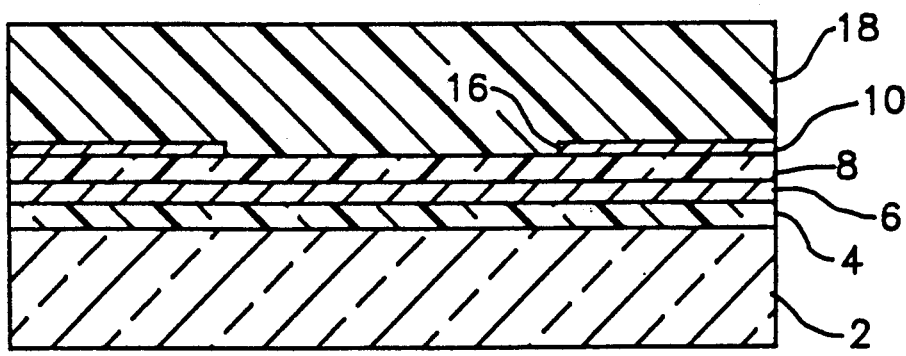
Figure 1D:
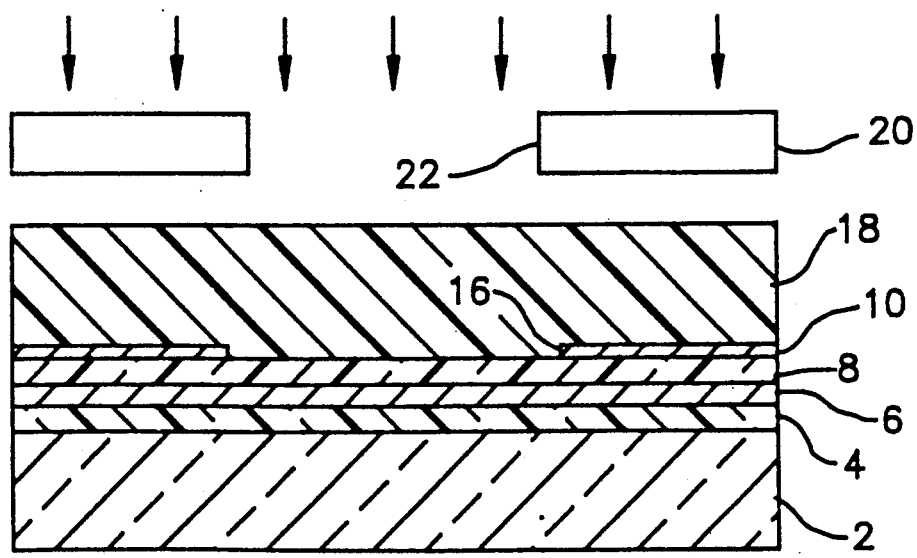

In the next step, illustrated in FIG. 1b, an opening 16 has been etched in the non-erodible mask 10 using the resist layer 12 as an etching mask, with the resist layer then removed. A thick layer of photoresist 18, typically about 30 microns thick, is then applied on top of the patterned non-erodible mask (FIG. 1c). Unlike the metal mask 10, the photoresist layer 18 may be considered an "erodible mask", since it can be selectively removed by reactive ion etching.

A glass mask 20 with an opening 22 corresponding to the lower end of the desired via is now positioned over the photoresist layer 18, and the photoresist under opening 22 is exposed. It will be noted that the diameter of opening 22 in glass mask 20 is significantly smaller than the diameter of window 16 in the non-erodible mask 10.

Figure 1E:
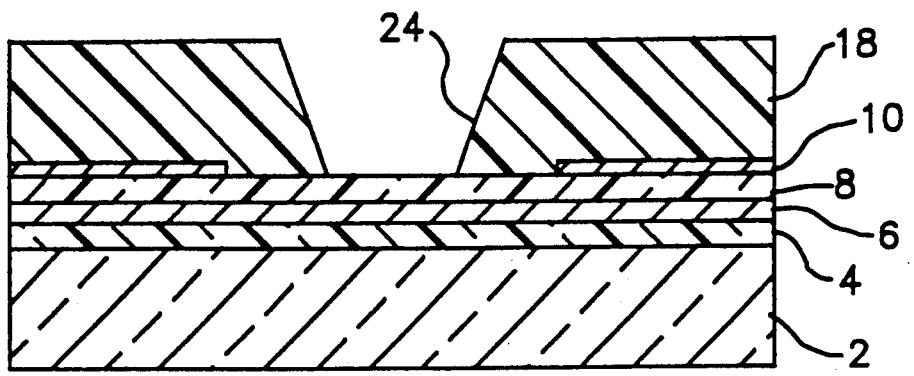

Referring now to FIG. 1e, a tapered opening is formed in the photoresist layer 18 by developing the previously patterned photoresist. The taper angle can be established in a conventional manner by an appropriate selection of the normality of the developer, and the duration, temperature and amount of ultraviolet light present for the develop step. Next, a via opening 26 is formed in the polyimide dielectric layer 8 by reactive ion etching, which is a well known dry process that avoids the polyimide/metal adherence problems encountered with the prior wet plating process.

As the etching process removes dielectric material vertically, it also erodes the photoresist laterally back from window 24. A suitable photoresist for this purpose is AZ4620 or AZ4903 by the Hoescht Company or Shippley, Inc. Additional portions of the dielectric are exposed for etching as the photoresist progressively recedes from the via area. The result is that the via opening 26 has a smaller diameter at its lower end, corresponding to the dielectric area initially exposed through photoresist window 24, and a progressively increasing diameter towards its top surface.

The reactive ion etching process can be controlled to establish any desired taper angle for the via opening 26. The controlling parameters are the gas content, the plasma energy, the pressure, the electrical bias, the duration of the etching process, the initial taper of the photoresist window 24, and the particular dielectric and photoresist materials selected. The photoresist will generally etch at a faster rate than the polyimide, typically at a ratio of about 3:1. Accordingly, the photoresist mask 18 should be considerably thicker than the polyimide dielectric layer 8, so that there is still some mask left when the via opening 26 has been etched completely through the dielectric layer. DuPont DeNemours Model 2611 polyimide is suitable in conjunction with the photoresist described above.

After the via opening 26 has been completed, the remaining photoresist 18 is removed by a stripper solution. The non-erodible mask 10 is also removed in this step, preferably by etching in a phosphoric acid solution. Alternately, the non-erodible mask 10 may be left in place if this is compatible with the subsequent metallization pattern. The result is a partially completed HDMI structure with a tapered via 26 that extends through the polyimide dielectric layer 8 to expose a portion of the underlying conductive ground plane 6 (FIG. 1g). In accordance with the invention, the controlling parameters for the via taper are selected such that the via is tapered at an angle of not more than 45° to the plane of the conductive layer 6. It has been discovered that, within this angular range, a metallization sputtered onto the via will achieve a generally uniform thickness, thus relieving the problems of thickness irregularities and voids encountered with the prior etched via process. While the via taper angle can be made arbitrarily small, an angle of less than about 15° can result in the via occupying an unduly large area without a corresponding enhancement in performance. A taper angle within the approximate range of 15°–45° will permit a metallization with a generally uniform thickness; an angular range of about 30°–45° is considered optimum in terms of minimizing the area occupied by the via while still achieving a substantially uniform metallization.

Figure 1F:
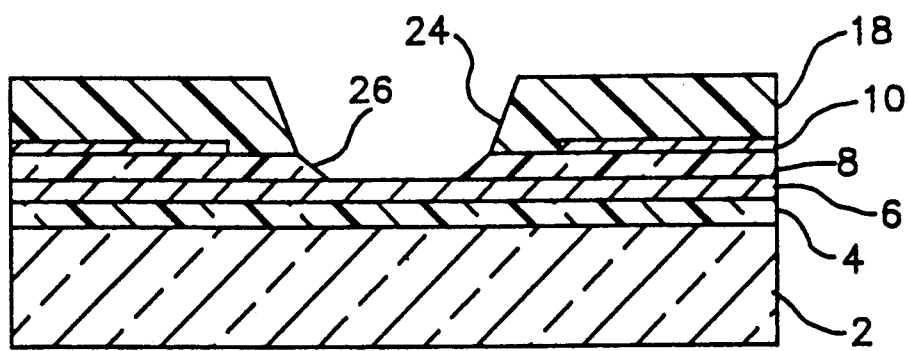
Figure 1G:
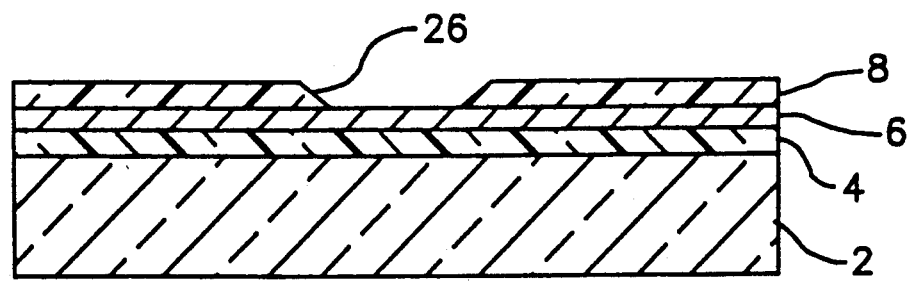
Figure 1H:
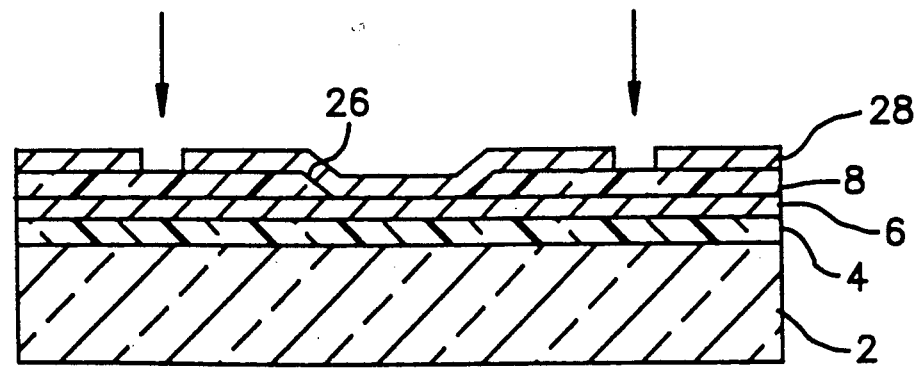

In the final step of the fabrication process, a conductive metal layer 28 is sputtered over the polyimide dielectric layer 8 (FIG. 1h). Metallization 28 extends down the sides of via opening 26 to contact the metallized ground plane 6 exposed through the via. The metallization 28, which typically will function as a power or signal plane, is then photolithographically patterned to isolate the via metallization from at least a portion of the polyimide dielectric layer 8 that was previously protected by non-erodible mask 10. This effectively isolates any pinhole defects in the dielectric immediately surrounding the via from the remainder of the dielectric layer that has been protected from pinhole defects by the non-erodible mask 10. Projection photolithography from a source separated by at least several feet from the photolithographic mask (not shown) is used to pattern the upper metallization layer 28, since proximity printers can create pinhole defects.

Figure 2A:
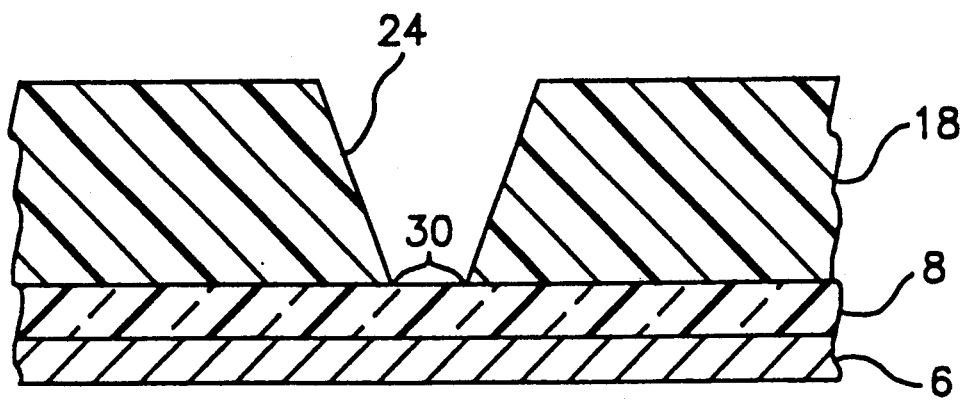
FIGs. 2a–2c are sectional views illustrating the progressive etching of a via through a dielectric layer, and correspond to the single step illustrated in FIG. 1f.
Figure 2B:
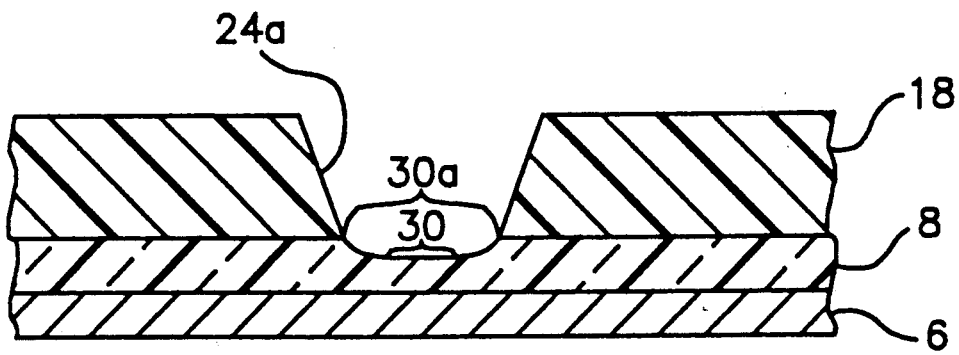
Figure 2C:
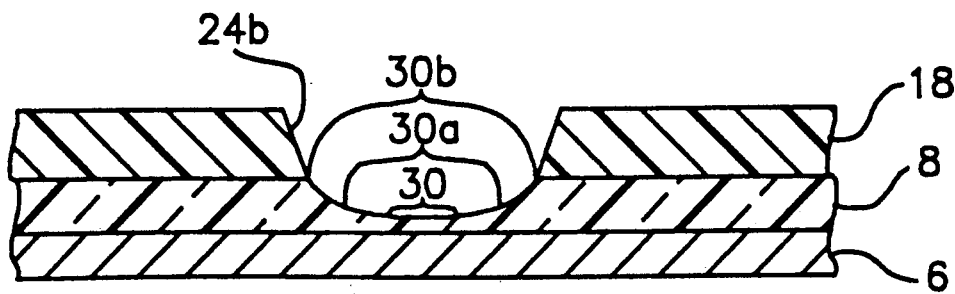

FIGS. 2a–2c expand upon FIG. 1f to illustrate the etching of via 26 in greater detail. FIG. 2a shows the situation immediately before reactive ion etching of polyimide dielectric layer 8 has begun. The window 24 in photoresist layer 18 exposes a relatively small portion of the underlying dielectric layer 8; this exposed portion will correspond to the bottom diameter of the finished via.

FIG. 2b illustrates the situation when the dielectric layer 8 has been etched about one-third of the way through. At the same time the polyimide is etched vertically, the photoresist 18 is also etched, causing its thickness to shrink and the via window to laterally recede back to the position indicated by numeral 24a. The via area in the polyimide thus expands to that indicated by numeral 30a. The partially formed via opening is deepest in the originally exposed area 30 which has been subjected to the reactive ion etch for the longest period of time, and progressively tapers to area 30a as it approaches the receded edge of the photoresist.

The progressive deepening and broadening of the via opening continues as the etching goes on; the situation with about two-thirds of the via completed is illustrated in FIG. 2c. At this point the photoresist layer 18 has been further thinned, and its via window has further receded back to the position indicated by numeral 24b. The via opening in the polyimide has now expanded to the area indicated by numeral 30b. The via opening will continue to both deepen and laterally expand until the underlying conductor layer 6 is exposed through area 30, at which time the etching is stopped. The result is a generally bowl-shaped via through the polyimide that can be established with a sufficient degree of taper to enable a generally uniform thickness of subsequent metallization, as discussed above.

Figure 3:
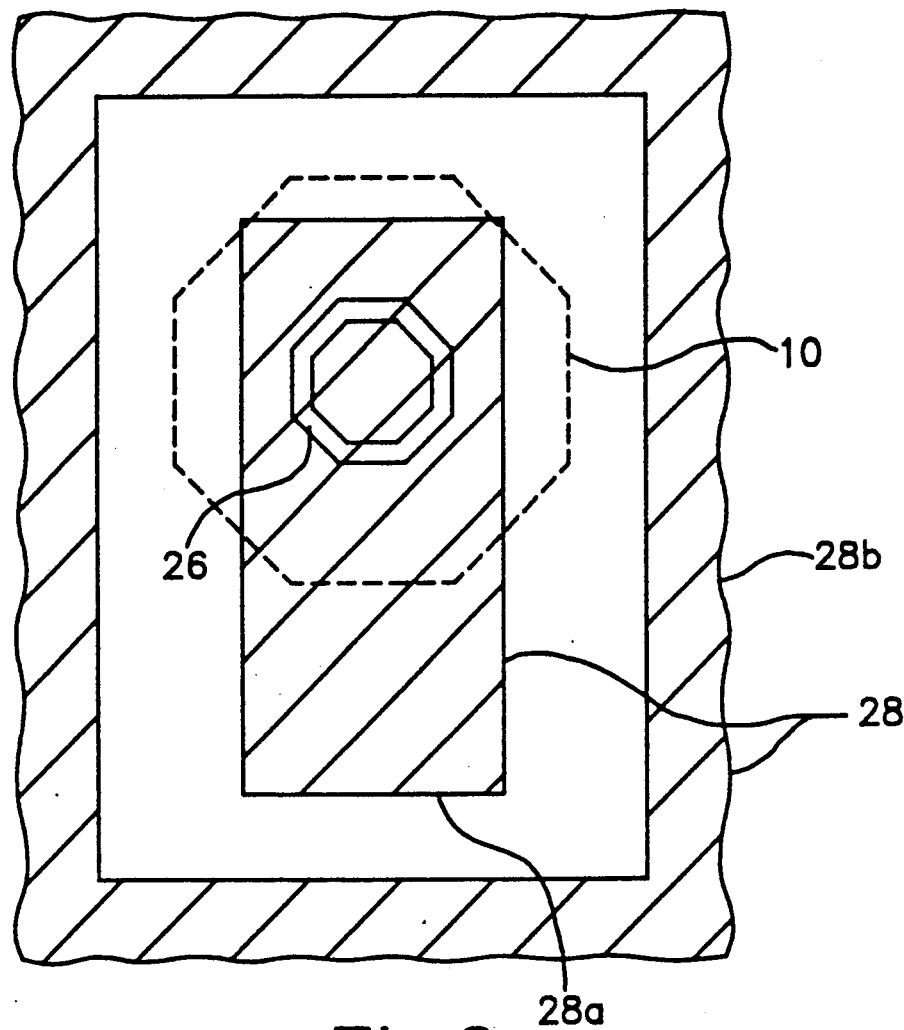
FIG. 3 is a plan view of a completed via in accordance the invention.

In one example which utilized the polyimide and photoresist materials mentioned above, a taper of approximately 30° to horizontal was achieved with the following etch parameters in a Drytek Corp. 384 Reactive Ion Etching System:
Ratio of $O_2$ to $SF_6$: 500/30
Pressure: 1150 mTorr
Duration: 8 minutes
Power: 700 watts
Bias: 0 volts FIG. 3 is a plan view of a completed via. The upper metallization 28 is indicated by diagonal stripes for clarity, although the view is not sectional. The inner portion 28a of the metallization is spaced and electrically isolated from the outer portion 28b of the metallization by a gap formed by projection photolithography, as discussed above. The boundary of the non-erodible mask 10, which normally would have been removed in a previous step, is indicated by a dashed line.

Figure 4:
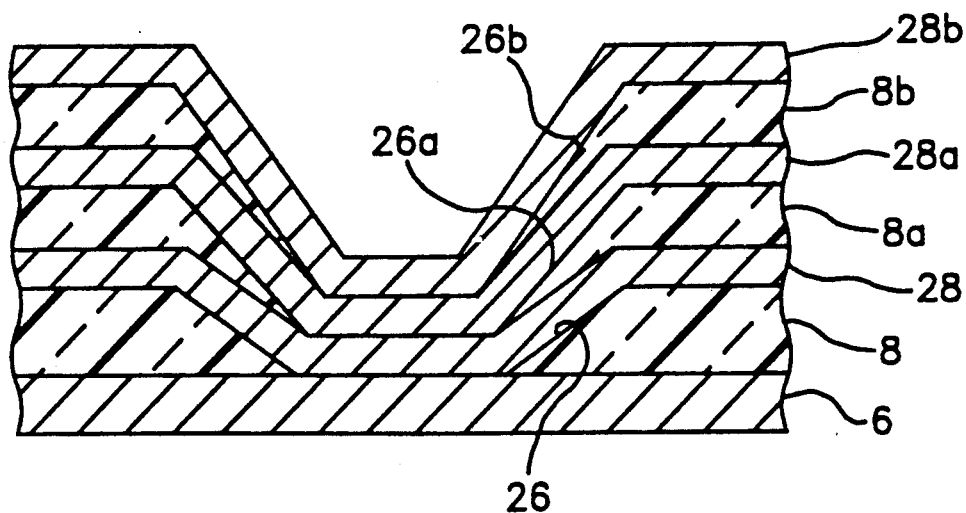
FIG. 4 is a sectional view showing a plurality of stacked vias in accordance with the invention.

The adaptability of the present invention to the stacking of vias in vertical alignment is illustrated in FIG. 4. A first conductive layer 6 carries a polyimide dielectric layer 8, with a second metallization layer 28 contacting lower conductive layer 6 through a via 26 which has been formed as described above. Next, a second polyimide layer 8a is laid down over metallization 28, a second via 26a is opened in polyimide layer 8a in alignment with the underlying via 26 by a process essentially similar to that described above, and another metallization layer 28a is sputtered over the polyimide dielectric layer 8a and into via 26a to contact the underlying metallization 28. Additional polyimide and metallization layers, such as 28b and 8b, can then be formed in a similar manner. The additional metallization layers will electrically contact the underlying metallizations through corresponding vias 26b, which are vertically aligned with the underlying vias. Although a limit to the number of layers that can be vertically stacked will eventually be reached because the taper angle of each subsequent via is somewhat greater than that of the immediately preceding via, the invention allows for a significant number of vertically stacked vias with a corresponding savings in the area required for the via interconnections.

Figure 5A:
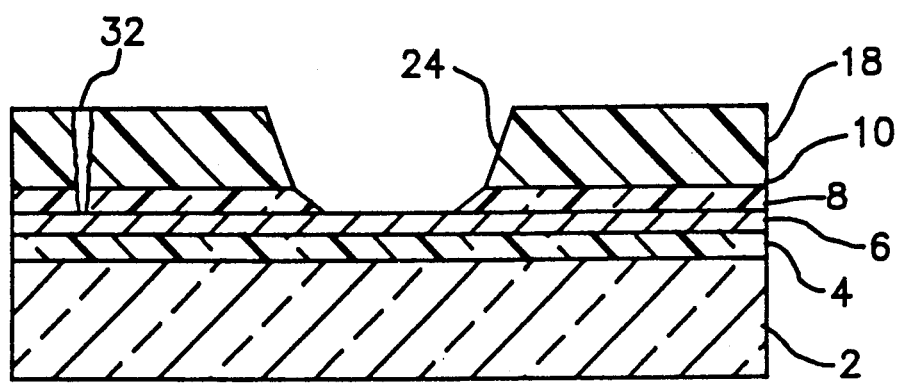
FIGS. 5a and 5b are sectional views illustrating a dielectric defect problem resulting from the use of an erodible mask in the invention.
Figure 5B:
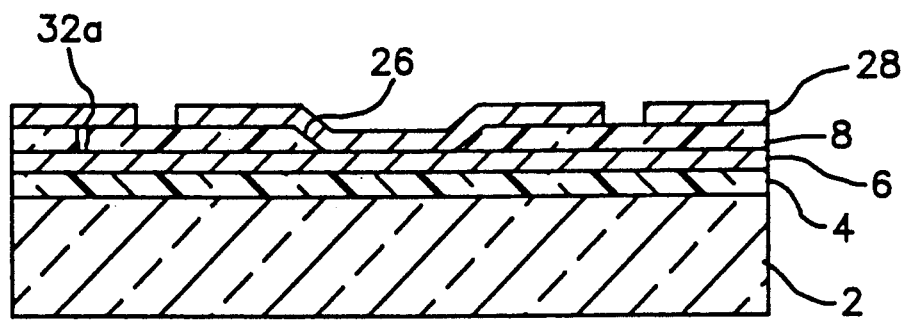

FIGS. 5a, 5b, 6a and 6b illustrate the function of non-erodible mask 10. In FIG. 5a, an intermediate stage of the via fabrication corresponding to FIG. 1f, but without the presence of metal mask 10, is shown. Pinhole defects 32 are often encountered in the photoresist mask 18, and during the reactive ion etching process these defects can propagate or replicate into the underlying polyimide dielectric layer 8. The result, illustrated in FIG. 5b, is that a pinhole defect 32a replicated in the polyimide layer can short circuit the upper power plane metallization 28 to the lower ground plane metallization 6, thus effectively destroying the functionality of this part of the circuit.

Figure 6A:
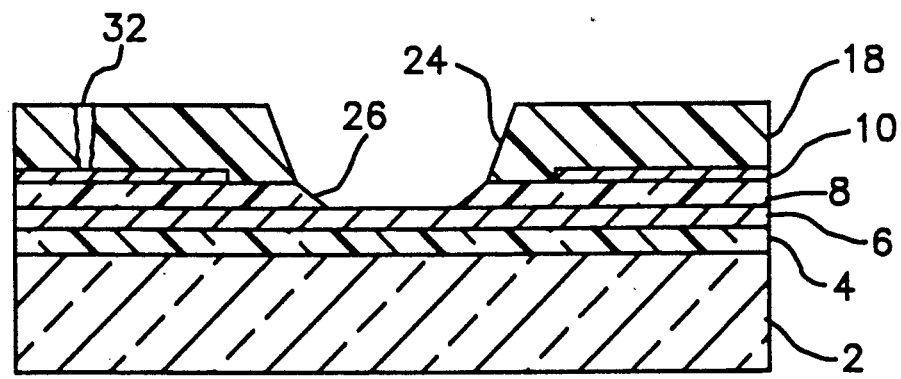
FIGS. 6a and 6b are sectional views illustrating the solution to the dielectric defect problem by the use of an underlying non-erodible mask.
Figure 6B:
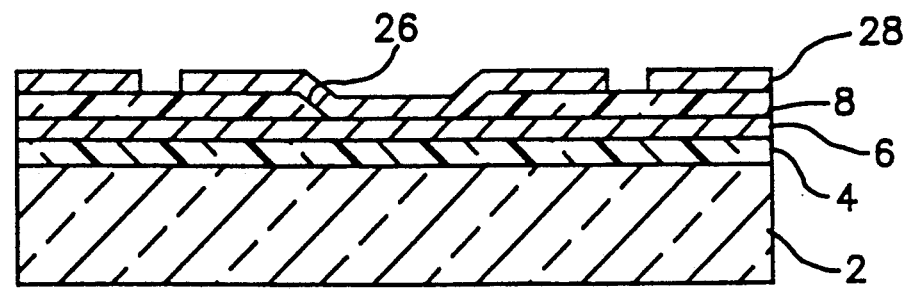

When the non-erodible mask 10 is used, as illustrated in FIG. 6a, a pinhole defect 32 in the photoresist is blocked from propagating into the underlying polyimide dielectric layer 8. As a result, the completed structure in FIG. 6b will have its power plane and ground plane metallizations 28 and 6 separated by a dielectric layer 8 that is free of pinhole defects, thereby isolating the two planes from each other in the areas lateral to the via connection.

The likelihood of pinhole defects increases as the size of the substrate and its associated power and ground planes increases. The non-erodible mask 10 is required to achieve substrates 10 cm square or larger, and increases the yield for smaller substrates.

While illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of forming a via through a first layer of material which overlies a second layer of material, comprising:

forming a laterally erodible mask over said first layer with a window in said mask over the desired via location, eroding mask material laterally around said window to expand said window, and simultaneously therewith eroding material from said first layer which is exposed through said window, the eroded portion of said first layer having a taper in the area underlying the laterally eroded portion of said mask, the degree of taper angle being determined by the materials selected for said mask and first layer, the erosion conditions, and the initial window taper;

said first layer comprising a dielectric, and said second layer comprising a conductor;

forming a non-erodible mask between said dielectric layer and said erodible mask in an area lateral to said via, forming said via with said non-erodible mask in place, removing said non-erodible mask and any remaining portion of the erodible mask after said via has been formed, and forming a second conductive layer over said dielectric layer over at least a portion of the area from which said non-erodible mask was removed, said non-erodible mask resisting the replication of defects from the erodible mask through the non-erodible mask into the dielectric layer during said erosion step.

2. The method of claim 1, wherein said dielectric is eroded through said conductor in the area underlying the portion of the dielectric that was exposed by the original mask window.

3. The method of claim 2, further comprising the step of depositing a layer of conductor material over the tapered walls of said via into contact with said conductor layer, the degree of taper of said walls being selected to support a deposit of conductor material with a generally uniform width.

4. The method of claim 3, further comprising the steps of forming a similar via in at least one similarly layered structure by a substantially similar process, said layered structures being stacked with their respective vias vertically aligned and electrically connected.

5. The method of claim 2, the thicknesses of said erodible mask and dielectric layer being selected so that said dielectric is eroded through to said conductor layer while a portion of said erodible mask remains on said dielectric layer.

6. The method of claim 1, said non-erodible mask having a window surrounding the via which is larger than the final eroded area of the via.

7. The method of claim 6, wherein said second conductive layer extends into said via and coats the walls thereof, further comprising the step of patterning said second conductive layer by projection lithography to electrically isolate said via from at least a portion of the second conductive layer which overlies at least a portion of said area from which said non-erodible mask was removed.

8. The method of claim 1, said non-erodible mask being formed from a metal.

9. The method of claim 1, said mask material and first layer material being eroded by reactive ion etching.

10. The method of claim 1, the taper angle of said via being in the approximate range of 15°–45° to the plane of said second layer of material.

11. The method of claim 1, said via being formed with a generally bowl-like profile.

12. A method of forming a via through a dielectric layer which overlies a conductive layer, comprising:

forming a layer of photoresist over said dielectric layer, opening a tapered window in the photoresist over the desired via location.

simultaneously etching said photoresist and the portion of the dielectric layer exposed by said window, the etching parameters, the materials for said dielectric and photoresist, and the degree of taper for said window being selected so that said window expands and progressively exposes additional portions of said dielectric as said etching proceeds, whereby a via having walls with a desired degree of taper is etched through said dielectric, forming an etch-resistant mask between said dielectric layer and said photoresist layer in an area lateral to said via, forming said via with said etch-resistant mask in place, removing said etch-resistant mask and any remaining portion of the photoresist after said via has been formed, and forming a second conductive layer over said dielectric layer over at least a portion of the area from which said etch-resistant mask was removed, said etch-resistant mask being selected from a material which resists the replication of defects from the photoresist through the etch-resistant mask into the dielectric layer during etching.

13. The method of claim 12, said etch-resistant mask having a window surrounding the via which is larger than the final etched area of the via.

14. The method of claim 13, wherein said second conductive layer extends into said via and coats the walls thereof, further comprising the step of patterning said second conductive layer by projection lithography to electrically isolate said via from at least a portion of the second conductive layer which overlies at least a portion of said area which said etch-resistant mask was removed.

15. The method of claim 12, further comprising the step of depositing a layer of conductor material over the tapered walls of said via into contact with said conductor layer, the degree of taper of said walls being selected to support a deposit of conductor material with a generally uniform width.

16. The method of claim 12, wherein said etching comprises a reactive ion etching.

17. The method of claim 12, the taper angle of said via being in the approximate range of 15°–45° to the plane of said conductive layer.

18. The method of claim 12, said via being formed with a generally bowl-like profile.

* * * * *